US012249967B2

(12) United States Patent
Friant et al.

(10) Patent No.: US 12,249,967 B2
(45) Date of Patent: Mar. 11, 2025

(54) CONTENT AUDIO ADJUSTMENT

(71) Applicant: Comcast Cable Communications, LLC, Philadelphia, PA (US)

(72) Inventors: Sarah Friant, Philadelphia, PA (US); Colleen Szymanik, Philadelphia, PA (US); Myra Einstein, Philadelphia, PA (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 0 days.

(21) Appl. No.: 17/697,002

(22) Filed: Mar. 17, 2022

(65) Prior Publication Data

US 2022/0321075 A1 Oct. 6, 2022

Related U.S. Application Data

(63) Continuation of application No. 15/994,085, filed on May 31, 2018, now Pat. No. 11,323,086.

(51) Int. Cl.
*H03G 3/32* (2006.01)
*G10L 21/0216* (2013.01)
(Continued)

(52) U.S. Cl.
CPC ............ *H03G 3/32* (2013.01); *G10L 21/0316* (2013.01); *G10L 25/78* (2013.01); *H04R 5/04* (2013.01);
(Continued)

(58) Field of Classification Search
CPC .......... H04R 3/00; H04R 29/001; H04R 5/04; G10L 25/48; G10L 21/0316; G10L 25/78; G10L 21/0216; H03G 3/3089; H03G 3/32
See application file for complete search history.

(56) References Cited

U.S. PATENT DOCUMENTS 5,530,761 A 6/1996 d'Alayer de Costemore d'Arc
5,778,077 A 7/1998 Davidson
(Continued)

FOREIGN PATENT DOCUMENTS

WO    WO-9953612      * 10/1999    ............... H03G 3/00
WO    WO 2013115748   *  1/2012    ............... H04S 7/00

OTHER PUBLICATIONS

Adaptive signal processing Book by Bernard Widrow (Year: 1985).*
(Continued)

*Primary Examiner* — Yosef K Laekemariam
(74) *Attorney, Agent, or Firm* — Banner & Witcoff, Ltd.

(57) ABSTRACT

Methods, systems, and apparatuses are described for optimizing user content consuming experience by recognizing and classifying different sounds while a user views a program. The system may have or may access information related to the program audio being presented, enabling it to distinguish between conversations occurring in the program audio and conversations between users in the viewing environment. The system may turn the program volume down on one or more sound producing devices if it detects a conversation. The system may turn the program volume up if it detects an interrupting noise. The system may also adjust the program content based on locations of various objects within the listening or viewing environment, and types of users in the environment.

24 Claims, 7 Drawing Sheets

(51) Int. Cl.
*G10L 21/0316* (2013.01)
*G10L 25/78* (2013.01)
*H04R 5/04* (2006.01)

(52) U.S. Cl.
CPC ... *G10L 2021/02166* (2013.01); *H04R 2430/01* (2013.01)

(56) References Cited

U.S. PATENT DOCUMENTS

| | | | |
|---|---|---|---|
| 6,151,397 A * | 11/2000 | Jackson, Jr., II | G10L 21/0208 381/94.1 |
| 7,039,199 B2 | 5/2006 | Rui | |
| 7,171,003 B1 | 1/2007 | Venkatesh et al. | |
| 8,041,025 B2 | 10/2011 | Dolph et al. | |
| 8,314,893 B2 | 11/2012 | Ravi | |
| 8,402,498 B2 | 3/2013 | George et al. | |
| 8,645,985 B2 | 2/2014 | Deshpande et al. | |
| 9,119,009 B1 | 8/2015 | Folkmanis et al. | |
| 9,398,247 B2 | 7/2016 | Tateishi | |
| 2002/0144259 A1 | 10/2002 | Gutta et al. | |
| 2003/0133551 A1 | 7/2003 | Kahn | |
| 2007/0250901 A1 | 10/2007 | McIntire et al. | |
| 2009/0022329 A1 * | 1/2009 | Mahowald | H03G 3/32 381/57 |
| 2011/0095875 A1 | 4/2011 | Thyssen et al. | |
| 2012/0271632 A1 | 10/2012 | Do et al. | |
| 2014/0176813 A1 | 6/2014 | Conness et al. | |
| 2014/0313417 A1 * | 10/2014 | Tateishi | H04N 21/44218 348/683 |
| 2015/0104026 A1 | 4/2015 | Kappus et al. | |
| 2015/0137998 A1 | 5/2015 | Marti et al. | |

OTHER PUBLICATIONS

"Features of Hearing Aid Technology", Adult Audiology, Washington University Physicians, retrieved from http://hearing.wustl.edu/Hearing-Aids/Features-of-Hearing-Aid-Technology on Jul. 25, 2018.

* cited by examiner

CONTENT AUDIO ADJUSTMENT

CROSS-REFERENCE TO RELATED APPLICATIONS

This application is a continuation of and claims priority to U.S. patent application Ser. No. 15/994,085, filed on May 31, 2018. The above-referenced application is incorporated herein by reference in its entirety.

BACKGROUND

Trying to watch an audiovisual program in a noisy environment (e.g., if others are in the room having a conversation) can be challenging as the viewer attempts to hear the program's audio over the conversation. Similarly, those having the conversation may also be bothered by the audio of the program. In such a situation, the program viewer and the conversants may all be resigned to having a less-than-optimal experience.

SUMMARY

The following summary presents a simplified summary of certain features. The summary is not an extensive overview and is not intended to identify key or critical elements.

A computing system may automatically adjust the volume of one or more sound generating devices, such as speakers in a room, for example, by increasing the volume of speakers near a person who is trying to watch an audiovisual program, and/or decreasing the volume of speakers near persons who are trying to have a conversation. A listening device comprising a microphone array may be present in the room in which a user is viewing a program. The listening device may have access to information about the program (e.g, audiovisual content) the user is viewing, such as the program's expected audio. The listening device may use the expected audio from the program and detected audio from the microphone to determine when a conversation is occurring between the user in the room and another person, as opposed to a conversation that is occurring within the program. The listening device may also determine the location of users and objects within the room based on the sounds they make. The listening device may also determine whether a conversation is part of program audio based on whether the sound of voices is coming from the location of a speaker. The listening device may adjust the program's volume or pause the program based on detecting a conversation between the user and another person. Based on detecting a noise that may disrupt the viewing experience of the user, the listening device may turn the program's volume up or pause the program.

These and other features and advantages are described in greater detail below.

BRIEF DESCRIPTION OF THE DRAWINGS

Some features are shown by way of example, and not by limitation, in the accompanying drawings. In the drawings, like numerals reference similar elements.

DETAILED DESCRIPTION

In the following description of various illustrative examples, reference is made to the accompanying drawings, which form a part hereof, and in which is shown, by way of illustration, various examples in which aspects of the disclosure may be practiced. It is to be understood that other examples may be utilized and structural or functional modifications may be made, without departing from the scope of the present disclosure.

Figure 1:
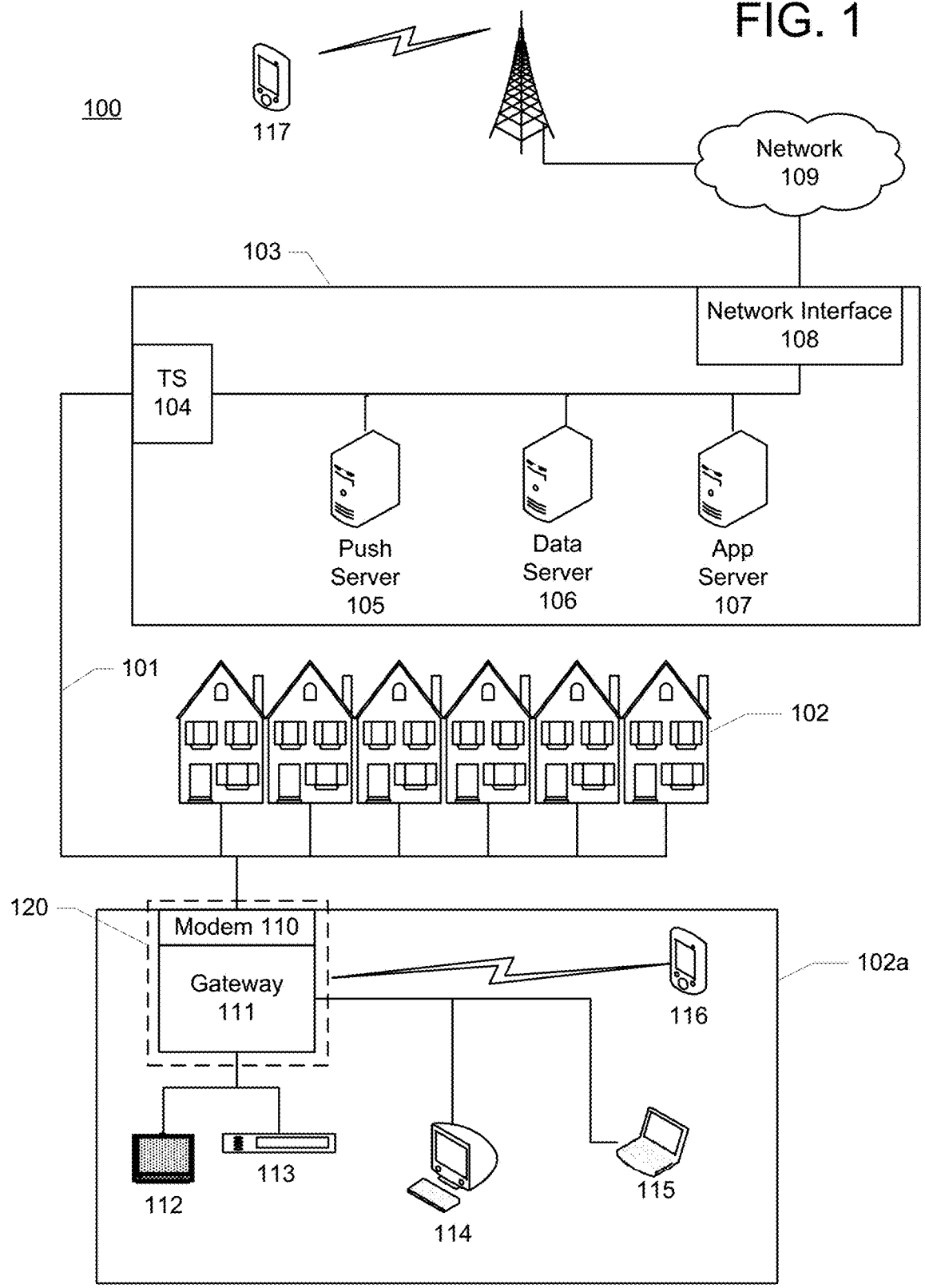
FIG. 1 shows an example information distribution network.

FIG. 1 shows an example communication network 100 on which many of the various features described herein may be implemented. The network 100 may be any type of information distribution network, such as satellite, telephone, cellular, wireless, etc. The network 100 may be an optical fiber network, a coaxial cable network, or a hybrid fiber/coax distribution network. Such networks 100 use a series of interconnected communication links 101, such as coaxial cables, optical fibers, or wireless links to connect multiple premises 102, such as businesses, homes, or user dwellings to a local office 103 or headend. The local office 103 may transmit downstream information signals onto the links 101 and the premises 102 may have receivers used to receive and to process those signals.

There may be one link 101 originating from the local office 103, and it may be split a number of times to distribute the signal to various premises 102 in the vicinity, which may be many miles, of the local office 103. The links 101 may include components such as splitters, filters, amplifiers, etc., to help convey the signal clearly, but in general each split introduces a bit of signal degradation. Portions of the links 101 may also be implemented with fiber-optic cable, while other portions may be implemented with coaxial cable, other lines, or wireless communication paths.

The local office 103 may include an interface 104, such as a termination system (TS). For example, the interface 104 may be a cable modem termination system (CMTS), which may be a computing device configured to manage communications between devices on the network of the links 101 and backend devices such as servers 105-07. The interface 104 may be as specified in a standard, such as the Data Over Cable Service Interface Specification (DOCSIS) standard, published by Cable Television Laboratories, Inc. (a.k.a CableLabs), or it may be a similar or modified interface. The interface 104 may be configured to place data on one or more downstream frequencies to be received by modems at the various premises 102, and to receive upstream communications from those modems on one or more upstream frequencies.

The local office 103 may also include one or more network interfaces 108, which can permit the local office 103 to communicate with various other external networks 109. These networks 109 may include, for example, networks of Internet devices, telephone networks, cellular telephone networks, fiber optic networks, local wireless networks, such as a WiMAX network, satellite networks, or any other desired network. These networks 109 may transmit content to the local office 103 via a plurality of variable size, fixed duration video fragments. Additionally, and/or alternatively, these networks 109 may transmit content to the local office 103 via a plurality of variable size, variable duration video fragments. The network interface 108 may include the corresponding circuitry needed to communicate on the external networks 109, and to other devices on the network such as a cellular telephone network and its corresponding cell phones.

As noted above, the local office 103 may include a variety of servers 105-07 that may be configured to perform various functions. The local office 103 may include a push notification server 105. The push notification server 105 may generate push notifications to deliver data or commands to the various premises 102 in the network or to the devices in the premises 102 that are configured to detect such notifications. The local office 103 may also include one or more content servers 106. The content servers 106 may be one or more computing devices that are configured to provide content to users at their premises. This content may be, for example, video content such as video on demand movies or television programs, songs, text listings, or other types of content. The content server 106 may include software to validate user identities and entitlements, to locate, retrieve and receive requested content, to encrypt the content, and to initiate delivery by streaming of the content to the requesting user or device. The content may comprise a plurality of fixed size, variable duration video fragments. The local office 103 may include a load balancer (not illustrated) to route service requests to one of the content servers 106. The load balancer might route the service requests based on utilization or availability of each of the content servers 106.

The local office 103 may also include one or more application servers 107. An application server 107 may be a computing device configured to offer any desired service, and may run various languages and operating systems, such as servlets and JSP pages running on TOMCAT/MYSQL, OSX, BSD, UBUNTU, REDHAT, HTML5, JAVASCRIPT, AJAX, or COMET. The application server 107 may be responsible for collecting television program listings information and generating a data download for electronic program guide listings. In some aspects of the disclosure, the application server 107 may be responsible for monitoring user viewing habits and collecting that information for use in selecting advertisements. The application server 107 may be responsible for formatting and inserting advertisements in a video stream being transmitted to the premises 102. Although shown separately, one of ordinary skill in the art will appreciate that the push server 105, the content server 106 and the application server 107, may be combined. Further, here the push server 105, content server 106, and the application server 107 are shown generally, and it will be understood that they may each contain memory storing computer executable instructions to cause a processor to perform steps described herein or memory for storing data.

An example premise 102a, such as a home, may include an interface 120. The interface 120 can include any communication circuitry needed to allow a device to communicate on one or more links 101 with other devices in the network. For example, the interface 120 may include a modem 110, which may include transmitters and receivers used to communicate on the links 101 and with the local office 103. The modem 110 may be, for example, a coaxial cable modem, for coaxial cable links 101, a fiber interface node, for fiber optic links 101, a twisted-pair telephone modem, a cellular telephone transceiver, a satellite transceiver, a local WiFi router or access point, or any other desired modem device. Also, although only one modem is shown in FIG. 1, a plurality of modems operating in parallel may be implemented within the interface 120. Further, the interface 120 may include a gateway interface device 111. The modem 110 may be connected to, or be a part of, the gateway interface device 111. The gateway interface device 111 may be a computing device that communicates with the modem 110 to allow one or more other devices in the premises 102a, to communicate with the local office 103 and other devices beyond the local office 103. The gateway interface device 111 may be a set top box 113 (STB), digital video recorder (DVR), computer server, or any other desired computing device. The gateway interface device 111 may also include local network interfaces to provide communication signals to requesting entities or devices in the premises 102a, such as display devices 112, for example, televisions, additional STBs 113 or DVRs, personal computers 114, laptop computers 115, wireless devices 116 such as wireless routers, wireless laptops, notebooks, tablets, netbooks, or smart phones, cordless phones, for example, Digital Enhanced Cordless Telephone-DECT phones, mobile phones, mobile televisions, personal digital assistants (PDA), landline phones 117, which may be Voice over Internet Protocol (VoIP) phones, and any other desired devices. Examples of the local network interfaces include Multimedia Over Coax Alliance (MoCA) interfaces, Ethernet interfaces, universal serial bus (USB) interfaces, wireless interfaces such as IEEE 802.11 or IEEE 802.15, analog twisted pair interfaces, Bluetooth interfaces, and others.

The gateway interface device 111 or a display device 112 may be used to view video content delivered from the content server 106. Additionally, the gateway interface device 111 or a display device 112 may be used to schedule recordings of the video content or to display a program listing indicating start and end times for video content.

Figure 2:
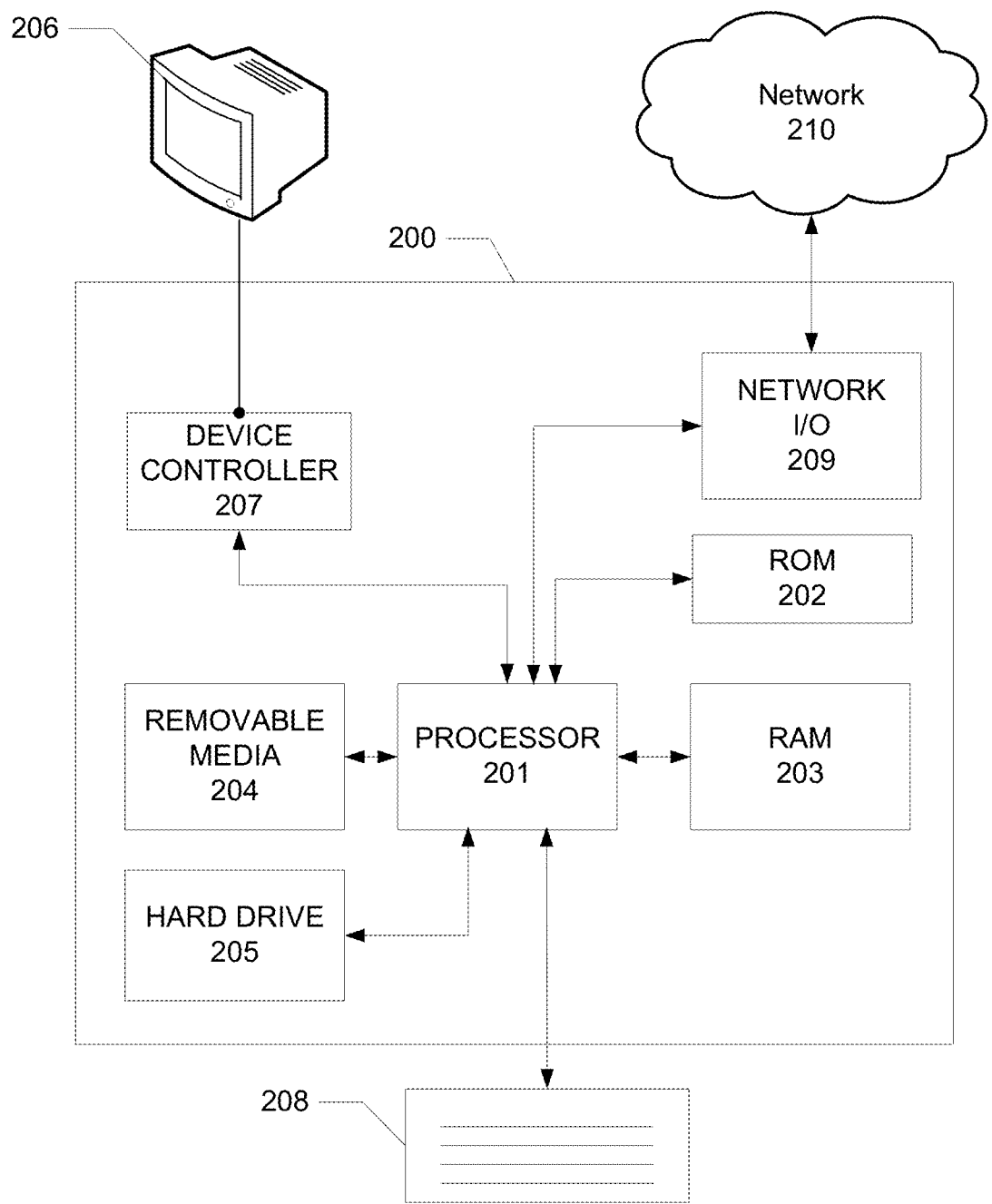
FIG. 2 shows general hardware elements of an example computing device.

FIG. 2 shows an example computing device that may be used to implement any of the methods described herein. A computing device 200 may include one or more processors 201, which may execute instructions of a computer program to perform any of the features described herein. The instructions may be stored in any type of computer-readable medium or memory, to configure the operation of the processor 201. For example, instructions may be stored in a read-only memory (ROM) 202, a random access memory (RAM) 203, a removable media 204, such as a Universal Serial Bus (USB) drive, a compact disk (CD) or a digital versatile disk (DVD), a floppy disk drive, or any other desired storage medium. The storage medium may comprise a plurality of sectors, wherein a size of each sector of the plurality of sectors is approximately a multiple of a substantially fixed fragment size. Instructions may also be stored in an attached, or internal, hard drive 205. The computing device 200 may include one or more output devices, such as a display 206, for example, an external television, and may include one or more output device controllers 207, such as a video processor. There may also be one or more user input devices 208, such as a remote control, keyboard, mouse, touch screen, microphone, etc. The computing device 200 may also include one or more network interfaces, such as a network input/output (I/O) circuit 209, for example, a network card, to communicate with an external network 210. The network I/O circuit 209 may be a wired interface, a wireless interface, or a combination of the two. The network I/O circuit 209 may include a modem, such as a cable modem, and the external network 210 may include the communication links 101 discussed above, the external network 109, an in-home network, a provider's wireless, coaxial, fiber, or hybrid fiber/coaxial distribution system, such as a DOCSIS network, or any other desired network.

FIG. 2 shows a hardware configuration of the device 200, but it should be understood that some or all of the illustrated components may be implemented as software. Modifications may be made to add, to remove, to combine, or to divide components of the computing device 200 as desired. Additionally, the components illustrated may be implemented using basic computing devices and components, and the same components (e.g., a processor 201, a ROM storage 202, a display 206, etc.) may be used to implement any of the other computing devices and components described herein. For example, the various components herein may be implemented using computing devices having components such as a processor executing computer-executable instructions stored on a computer-readable medium, as illustrated in FIG. 2. Some or all of the entities described herein may be software based, and may co-exist in a common physical platform. For example, a requesting entity can be a separate software process and program from a dependent entity, both of which may be executed as software on a common computing device.

One or more aspects of the disclosure may be embodied in a computer-usable data or computer-executable instructions, such as in one or more program modules, executed by one or more computers or other devices. Generally, program modules include routines, programs, objects, components, data structures, etc. that perform particular tasks or implement particular abstract data types if executed by a processor in a computer or other data processing device. The computer executable instructions may be stored on one or more computer readable media such as a hard disk, an optical disk, a removable storage media, a solid state memory, a RAM, etc. The functionality of the program modules may be combined or distributed as desired. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Figure 3:
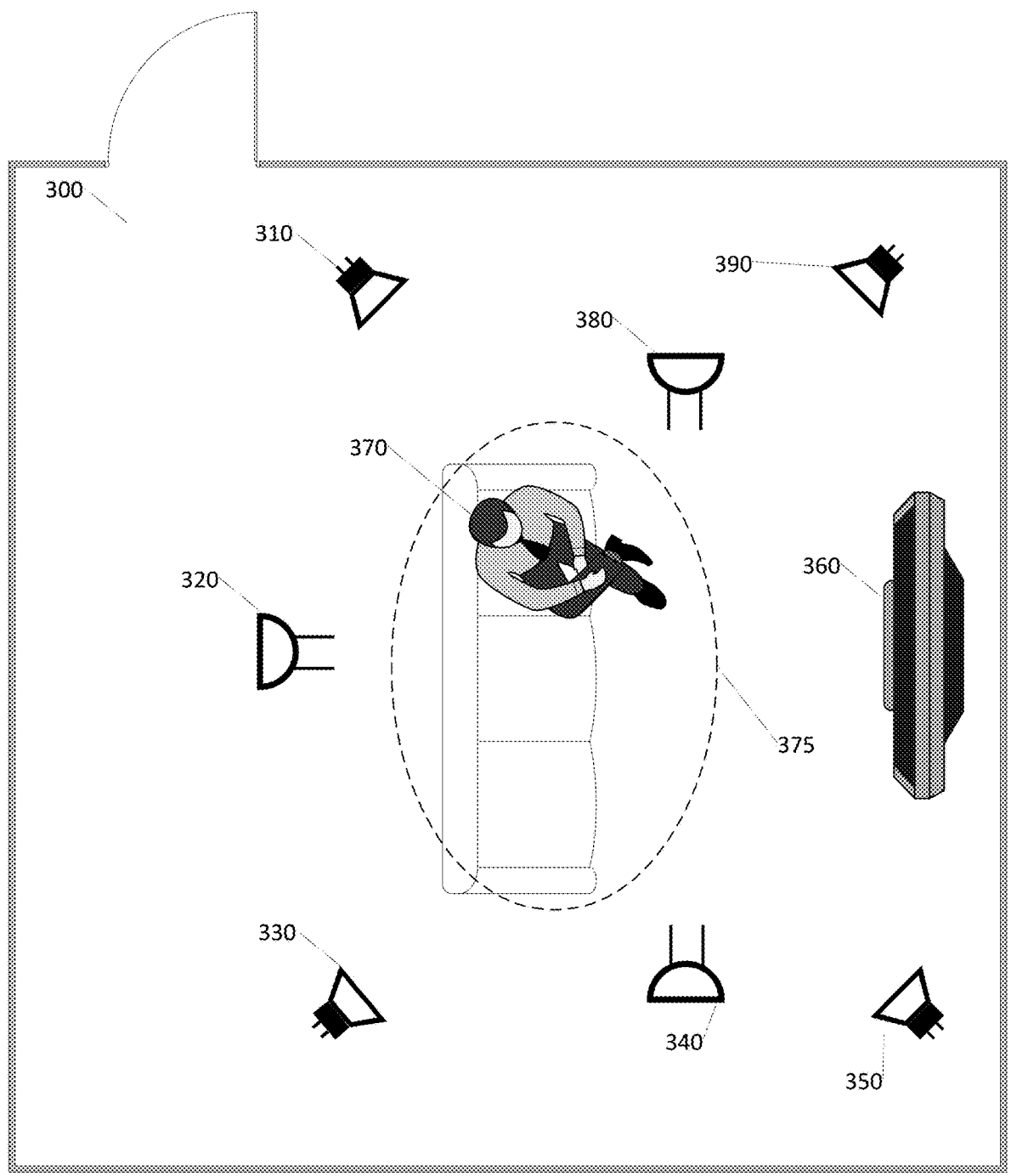
FIG. 3 shows an example program viewing environment.

FIG. 3 shows an example program viewing environment 300. Although program is used throughout this disclosure, this disclosure applies to any type of content that comprises audio. Thus, program is interchangeable with any content type including movies, television, audio books, media accessible via the internet, etc. A viewing environment may contain one or more speakers (310, 330, 350, 390), one or more listening devices (320, 340, 380) each with a microphone array, and a user 370 watching a program on display 360. A viewing environment may include the area from which a program on display is visible. A viewing environment may also include the area where a program on display is audible. A viewing environment may include rooms or outdoor areas that are adjacent to a room where the display is located. A speaker may include a hearing aid that is connected to WiFi or connected to the system via Bluetooth. The volume of the hearing aid may be adjusted just as any speaker may be adjusted. In some circumstances, a listening device may adjust the volume of the hearing aid while maintaining the volume of other speakers to accommodate for hearing impaired individuals. One or all of the listening devices may comprise, or be a part of, a microphone array. The microphone array may allow sound to be detected at a variety of locations. The microphone array may allow sound to be processed to allow triangulation of a source of a sound and to amplify sounds from different locations through any desired microphone beamforming technique. The speakers and microphones may be placed in various locations throughout a room. If a listening device detects an intruding sound (a sound that is not part of the program), the volume of the program may be adjusted up on one or more speakers to enable the user 370 to fully enjoy the program audio. The volume may be adjusted up if the intruding sound approaches or exceeds a threshold level. The threshold may be based on the current volume setting of the program. The viewing environment may also contain a sweet spot 375, which may be a location for a user to obtain the best viewing experience. The sweet spot 375 may be a location where the program audio from one or more speakers is heard at approximately the same volume and where the sound from each speaker reaches at approximately the same time.

A listening device 320 may make additional decisions and adjustments regarding the volume of a program on display 360. For example, the listening device may continuously detect sound from content to determine when to make adjustments. If the listening device determines that the sound from the content is muffled or quiet in one scene compared to other scenes, the listening device may turn up the volume because the scene is hard to hear. Alternatively/additionally the listening device may turn closed captioning on when it detects that a scene is quiet or muffled. In a similar manner, the listening device may determine when a loud scene has begun and may readjust the volume down or turn close captioning off. The listening device may determine that spoken words or words that are output from a speaker are muffled. To determine whether spoken words are muffled, the listening device may use machine learning to determine a volume level or threshold volume at which a person would begin to have difficulty understanding spoken words. The listening device may use machine learning to determine threshold volume preferences for individual users based on observing the user's adjustment of volume during different scenes. The listening device may also use machine learning to learn how people adjust volume based on the particular content they are watching. The listening device may learn patterns of adjusting volume level based on the scene within the program. The listening device may automatically adjust volume without user input based on the scene that is currently playing and based on parameters it has learned through machine learning algorithms.

Figure 4:
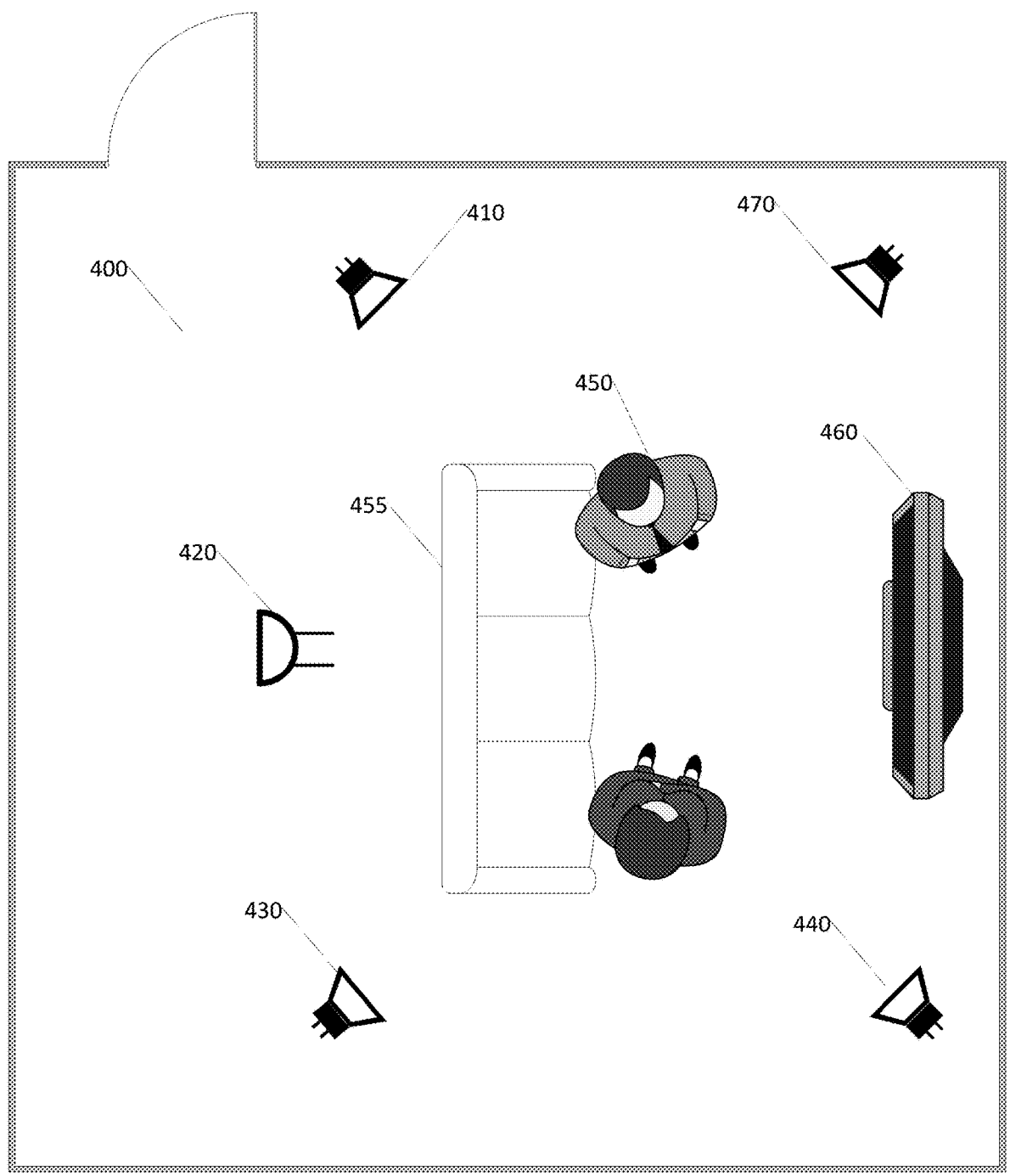
FIG. 4 shows an example conversation occurring in a program viewing environment.

FIG. 4 shows an example conversation occurring in a program viewing environment 400. A user 450 may engage in a conversation while viewing a program on display 460. Listening device 420 may have access to program information including audio for the program on display 460. The listening device 420 may detect a sound (e.g., the user's voice) that it determines is part of a conversation the user is engaged in. The listening device 420 may adjust the volume of the program down to enable the user to continue the conversation more easily. Alternatively, the listening device 420 may pause, record, or otherwise alter the presentation of the program on display 460 to accommodate the conversing viewer. The system may also differentiate between conversations that are by people viewing the program and conversations that are by non-viewers. The system may determine the location of the conversation and if it is within a designated area (e.g., on couch 455), then the system may determine that the conversation is by users that are viewing a program. If the location of the conversation is outside of a designated area, then the system may determine that the conversation is by people that are not viewing the program. After determining that the conversation is by people viewing the program, the system may turn down the program volume during the conversation or make any other adjustment discussed elsewhere in this disclosure.

Figure 5:
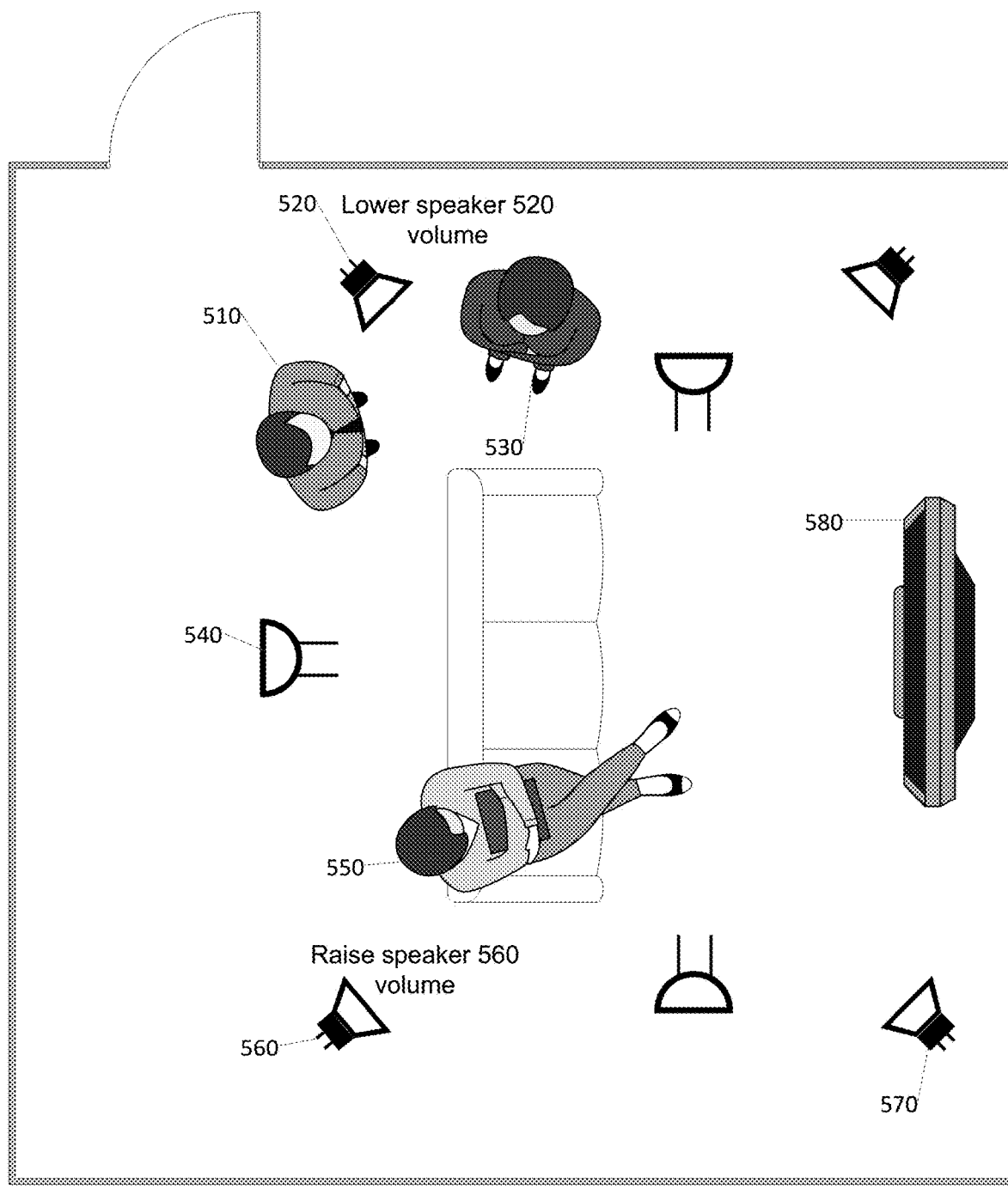
FIG. 5 shows an additional example conversation occurring in a program viewing environment.

FIG. 5 shows an additional example conversation occurring in a program viewing environment 500. A user 530 may begin a conversation with a person 510 while viewing a program on a display 580. The person 510 may be located within the viewing environment 500. Alternatively, the person 510 may be located remotely and may be having a conversation with the user 530 through a device.

The listening device 540 may determine the location of people and other objects throughout the viewing environment. For example, the listening device may have identified the location of viewer 550 because it detected the sounds of footsteps that ended where viewer 550 is currently sitting. The listening device 540 may also determine the location of viewer 550 by detecting other sounds created by viewer 550 such as movements, voice, or the heartbeat of viewer 550. The listening device 540 may determine the locations of user 530, person 510, speaker 520, and speaker 560. The listening device may also determine the direction speaker 520 and speaker 560 are facing based on the sounds received at the listening device's microphone array.

After detecting a conversation (e.g., by using speech recognition techniques) that is not part of the expected program audio, the listening device 540 may turn down the volume of speaker 520 because it is located within a determined distance from one or more sources of the conversation. The listening device 540 may turn up the volume of speaker 560 because viewer 550 is within a determined distance from speaker 560 and is also separated by a determined distance from one or more sources of the conversation. If user 530 begins a conversation (e.g., via a phone call) and person 510 is trying to view the program (e.g., the system may determine that person 510 is not participating in the conversation), then the listening device may turn the volume of speaker 520 down and turn closed captioning on. Alternatively the listening device may pause the program and/or turn up the volume on speaker 520 or other speakers. The listening device may perform any action according to user preferences.

Figure 6:
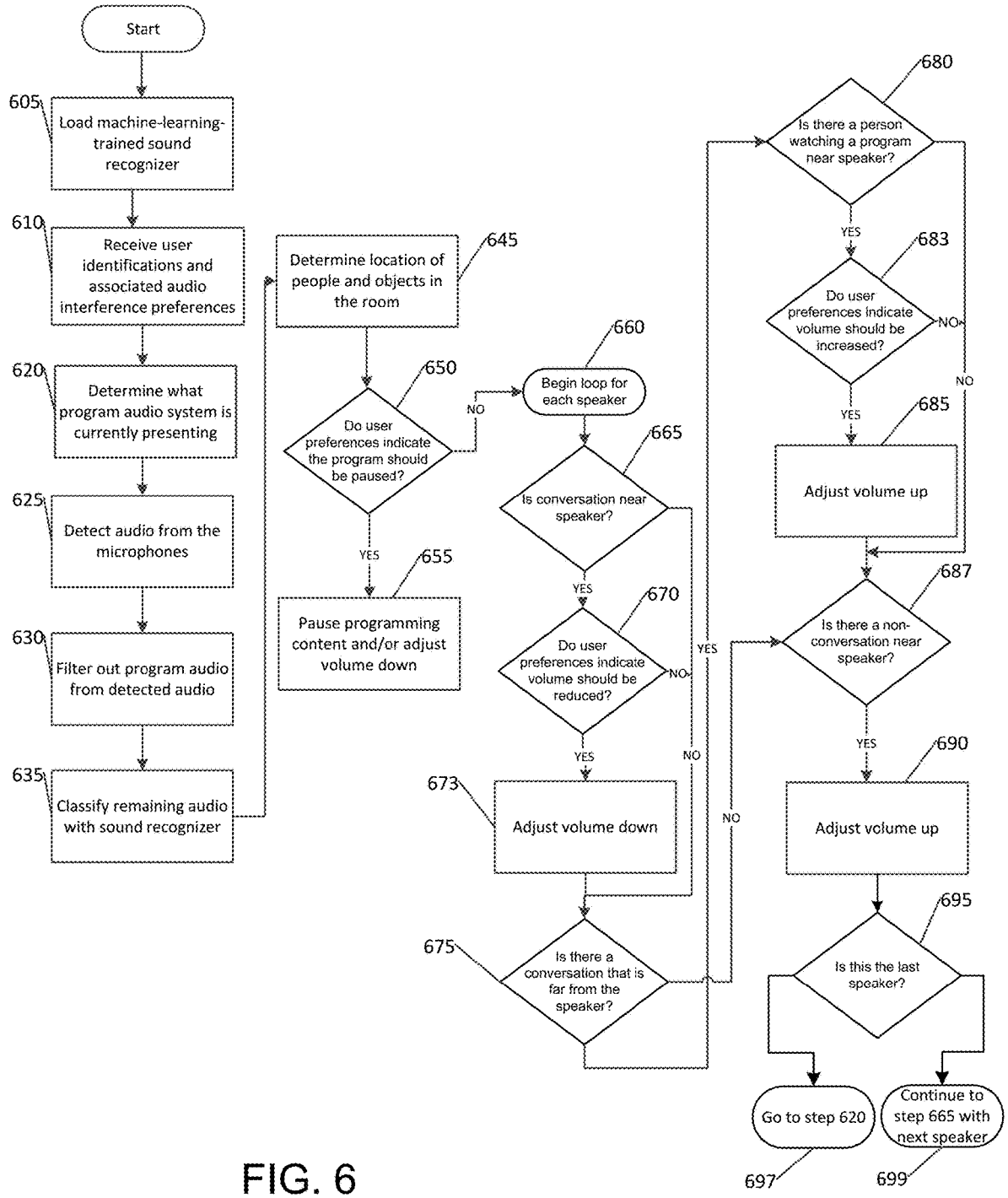
FIG. 6 shows an example method for adjusting programming content in a viewing environment.

FIG. 6 shows an example method for adjusting programming content in a viewing environment. The example method may be performed by a system that may comprise servers 105-107, network 109, computing devices 114-116, or any other component described in FIGS. 1-7. The system may perform calculations or actions by a listening device and/or may perform calculations or actions by a computing device. The computing device may be located locally within the viewing environment or it may be located remotely from the residence, such as in the local office 103. The steps below may be performed by the components in the system. For example, portions or all of steps 605-695 may be performed by the listening device and/or computing device.

FIG. 6 shows many method steps in one example sequence, and methods according to the disclosure can be implemented with different sequences, and with additional steps or skipping steps. In step 605, the system may load a sound recognizer. The sound recognizer may be able to recognize or classify different sounds. For example the sound recognizer may be able to identify the sound of a footstep, a person speaking, a heartbeat or any other type of sound. The sound recognizer may be a program that has been trained using machine learning techniques including for example, statistical machine learning methods or deep neural networks.

In step 610, the system may receive user identifications and their associated audio interference preferences. The identifications may be associated with an account of a user. The preferences may be entered through GUI 700. The preferences may indicate what actions a user prefers the system to perform under different circumstances. For example, a user may indicate whether they want the volume to automatically be turned up when an interfering conversation is detected to be near the user. The user may specify whether a show should simply be paused due to an interfering noise such as a conversation. The user may specify audio interference preferences for specific programs. The user may also specify audio interference preferences for types of programs (e.g., programs on a specific channel, pay-per-view programs, primetime programs, programs of a certain genre, etc.).

The user may also set audio interference preferences that relate to how many people (e.g., more than 5, less than 3, etc.) are in the viewing environment. For example, a user may specify that when there is a minimum number of people the volume adjustment preferences should not be followed. The user may also set preferences to make adjustments to the program output based on the level of ambient noise in the viewing environment. A user may also specify actions to be performed based on the occurrence of an event. For example, a user may specify that the program should pause when a doorbell rings. Other events may include the detection of a phone ringing, detection of an appliance turning on or off or finishing its current task. The system may be communicatively coupled (using Bluetooth, Wi-Fi, or any other communication protocol) with various appliances and the appliances may inform the system of the status of any tasks the appliances are performing.

The user audio interference preferences may also be obtained from a smart phone or other mobile device. The preferences can be saved in an account associated with the user or an application on the mobile device.

In step 620, the system may determine what program audio the system is currently presenting. The system may determine what program audio the system is currently presenting by communicating with a DVR or set-top box and requesting the audio and other information corresponding to the program. The DVR or set-top box may have access to a video file that contains audio and video of the program that is being played (e.g., from an incoming stream or a recorded program in the DVR memory), and may transmit the audio to the listening device or any other component to be used in the audio processing and/or filtering. Alternatively, the system in the viewing environment may obtain the audio and other information directly from a local office 103 or head end. The listening device and/or other computing device within the viewing environment may also receive content audio via Bluetooth, wire, or Wi-Fi, etc. A listening device within the system may obtain the program audio from a DVR or set-top box that is capable of communicating with a local office or head end 103. The listening device may receive the audio via Bluetooth, wire, Wi-Fi, etc., and may filter that audio out of the audio received by the microphones, to better isolate the conversation in the room. The system may obtain a copy of the audio and other information related to the program being presented such as title, duration, rating, the closed captioning track, whether the program is being rented, whether the program is being recorded, etc. The information corresponding to the program may be used in adjusting the program according to user audio interference preferences as discussed elsewhere in this disclosure.

The system may use a television schedule to determine what program (e.g., program title) is playing on the channel that is being displayed. The system may use the channel or the television schedule to make a request from the head end for the audio that corresponds to the channel or the program title. The system may make the request to the head end via the Internet, and may deliver the received program audio to a listening device (e.g., listening device 320, 340, or 380) and/or a computing device that is located locally within the viewing environment or located remotely. Downloading the audio may be performed prior to actual presentation of the audio, and providing the audio in advance may allow time for improved audio filtering. Alternatively, the audio may simply be sampled from the audio being presented to the user. For example, if the DVR is outputting the audio and video for a movie, the DVR can also transmit (e.g., via a local wireless connection) the movie's audio to the listening device and/or other computing device for use in filtering out the movie audio from the microphone input.

For example, a user may decide to watch The Voice using the system. The system may receive a copy of the audio of The Voice from a local office 103 as the user turns to a channel that is displaying The Voice. Alternatively, the system may receive portions of the audio from The Voice over the course of the show. For example, the system may receive portions of the audio at 10 different times throughout the course of the show where each portion contains the next 3 minutes of audio.

In step 625, the system may detect audio from the microphones. Alternatively, the microphones may be constantly transmitting their detected signals. The signals may be buffered and accessed for processing in step 625. The system may repeatedly sample the viewing environment. Each sample may include audio, and/or if cameras are used, pictures and video. Each new sample may be compared against some number of previous samples to determine changes to the viewing environment. Based on the differences, the system (either at the device or processed at the cloud and relayed back down to the device) may communicate to an encoder or display device to make necessary changes to the program audio.

In step 630, the system may filter out program audio from the detected audio. The system may be able to identify program audio within the detected audio using a copy of the program audio it obtained previously. The system may filter out the program audio using any desired noise cancellation technique, such as by applying an inverse of the program's audio to the audio signal detected by the microphones, to cancel out that portion of the detected audio.

In step 635, the system may classify the remaining audio with a sound recognizer. The system may classify different portions of the filtered detected audio. For example, the filtered detected audio may contain conversation sounds and non-conversation sounds that may be recognized and classified by the sound recognizer.

The classification of sounds can include determining whether a sound is part of a conversation. The system may also determine an approximate age of the participants in the conversation. The system may classify the participants of the conversation as adult or child, and may identify the language the participants are conversing in. The relative age and classifications as adult or child may be determined through an analysis of voice signal for each speaker that is received by a listening device or microphone. The system may use the relative age and adult/child classification to adjust the program based on who is in the viewing environment. For example, if a family is watching a family show and the adults walk out then the system may pause the family show. Alternatively, if an adult leaves when a kids show or cartoon is on then the system might not pause the show. Alternatively, if adults are watching a program that is not suitable for young children and a child enters the viewing environment (e.g., to ask a question or to complain about not being able to sleep), the system may detect that a child has entered the viewing environment (e.g., based on the child's voice or sounds from the child's footsteps) and may adjust the program (e.g., pause the program, adjust the volume, turn off the display, etc.). The system may know what type of program is playing based on information received about a program in step 620.

The system may also determine whether a conversation is part of the program audio or not. The system may determine that a conversation is not part of the program audio because the sound of detected voices is coming from a location where no speaker is located. The system may have a higher confidence level if the sound of a voice is coming from a location where no speaker is located and there is no similar sound coming from the location of any of the speakers. Additionally/alternatively, the system may compare any detected voice with the audio of the program that is playing. If the detected voice does not match the audio of the program, the system may determine that a user is having a conversation. Additionally/alternatively, the system may also use words detected in audio received from a listening device or microphone and compare the words with the closed captioning of the program. The system may determine that a conversation is occurring in the viewing environment if the difference between words detected in the audio and words within the closed captioning of the program exceeds a threshold.

The system may also recognize and classify non-conversation sounds. For example, the system may recognize and classify sounds made by a dog, sounds from doors, appliances, fire alarms, and mobile devices. The system may also recognize and classify sounds from construction work, sirens, vehicles, gunshots etc. After detecting a non-conversation sound, such as the ring of a doorbell, the system may automatically, without user input adjust the volume of the program down. The system may classify each sound and may adjust the program according to a classification given to the sound. For example, after detecting a doorbell ring, the system may pause the program to give the users an opportunity to answer the door without missing a scene from the program.

In step 645, the system may determine the location of people and objects in the room. The system may identify the locations of people and objects in the room using sound or with cameras. The system may determine a location of a person by recognizing a sound made by the person. For example, the system may determine a location of a person after detecting the sound of a voice, laughter, or a glass being placed on a table. The system may update the location of the person each time a sound by the person is made in a new location. The system may also determine the location of a person through wearable devices such as a smart watch, electronic textiles, or a smartphone located within a user's pocket. A wearable device may use any localization technique (e.g., Global Positioning System, Bluetooth, cameras, etc.) to determine a location and communicate the location to the system. The system may also determine the direction each speaker is facing.

The system may consider a conversation to be nearby a speaker when the conversation is located within a predetermined distance from a speaker. For example, if the conversation is within 5 feet of a speaker the system may turn the volume of that speaker down. The user may change the predetermined distance used for determining whether a sound is near a speaker, making it larger or smaller.

The system may determine the location of a sweet spot, or a location within the viewing environment that is best for hearing the sound from the speakers. A sweet spot may be a location where a user can hear the program audio from the speakers at an even volume and it may be a location where the sounds from each speaker reach a user at approximately the same time. For example, the location of the sweet spot may be estimated using knowledge about the front, rear, left, and right tracks in the program audio. The system may determine which speaker is playing which audio track. If the system determines that a user is not located within the sweet spot, the system may adjust the volume of the speakers to adjust the sweet spot so that it is closer to the user. In addition, the system may delay the sound from one or more speakers to enable the sounds from one or more speakers to reach the user's location at the same time. If the system determines that the user is moving, it may wait until the user has been present in a location for a pre-determined amount of time before adjusting the sweet spot. For example, the system may recognize, based on the strength of input audio to a microphone that is part of an array of microphones that a user has moved from a position near the center to a position closer to the left rear speaker. After detecting the new location of the user, the system may lower the left rear speaker and raise the volume of the other speakers to provide a sweet spot effect on the user's new location.

Figure 7:
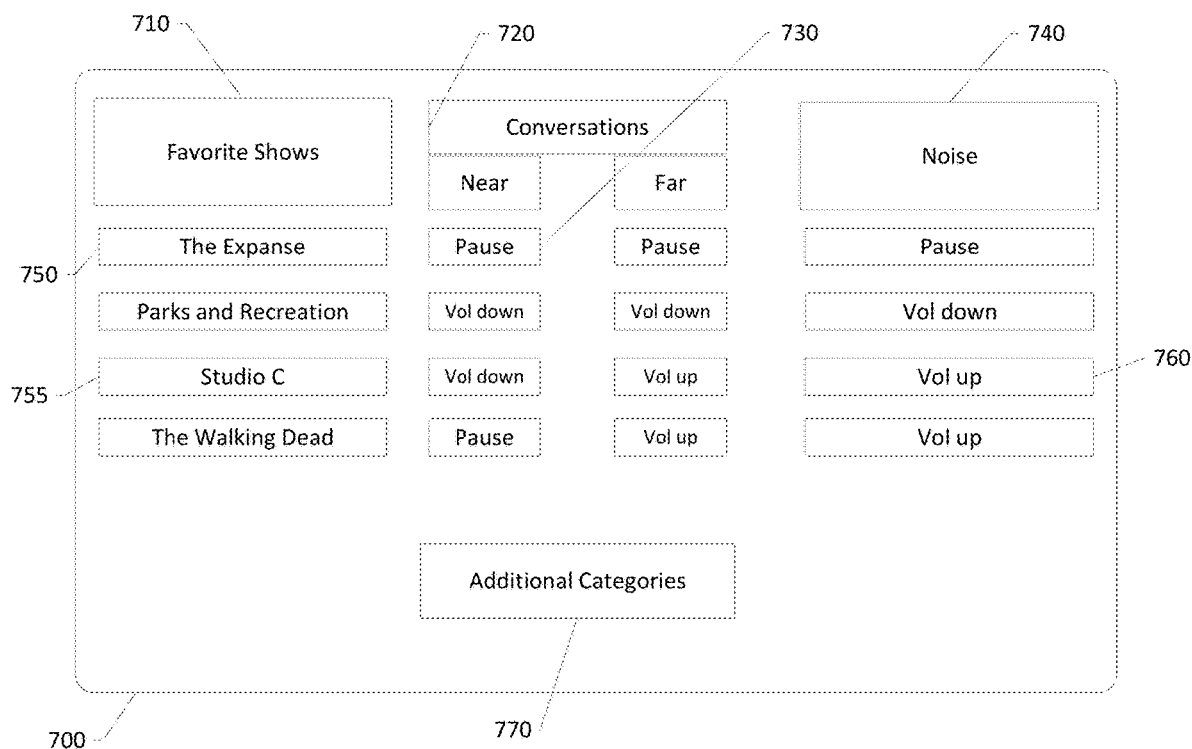
FIG. 7 shows an example graphical user interface for configuring user preferences.

In step 650, the system may determine whether user preferences indicate the program should be paused. User preferences may provide direction on what actions the system should take after detecting and recognizing different sounds. The user may use a graphical user interface, such as the graphical user interface shown on FIG. 7, to input the user's preferences. As shown in FIG. 7, a user may create a list of favorite shows 710. In column 720, the user may specify audio interference preferences for when the system detects a conversation near the user. For example, the user preference 730 may indicate that when show 750 is playing and a conversation is detected, the show 750 should be paused. In column 740 the user may specify preferences for when the system detects non-conversation or noise. For example, if a noise is detected during show 755, the user preference 760 may indicate that the system should turn up the volume. Alternatively, the user preferences may indicate that the volume should be turned down when a conversation is detected during a particular program. Alternatively, the user preferences may indicate that the volume should be turned up when a conversation is detected during a particular program.

The user may also have preferences for other categories in addition to favorite shows 710. The user may select Additional Categories 770 to enter in additional preferences. The user preferences may apply to broad categories of shows such as shows occurring during primetime or shows that are reruns. A user may enter preferences for volume or pausing for when commercials are playing. As an additional example, if a rented movie is playing and a user receives a phone call, the system may pause the movie until the phone call is over.

Additionally/alternatively, a user may have preferences for setting the volume level. These preferences may be based on the volume level of a conversation. The system may determine a volume level of a conversation and adjust the volume of the speakers so that their volume level is below the volume level of the conversation. The system may also determine the volume level of a non-conversation sound and adjust the volume of the speakers to be above the volume level of the non-conversation sound. If the non-conversation's volume level is so high that the speakers are not able to go above the non-conversation's volume level, then the system may pause the program until the non-conversation sound has ended.

Additionally/alternatively, a user may set preferences based on the type of scene that is playing on a program. The system may adjust the volume of the program on a scene by scene basis. The system, may determine that one scene is much louder or quieter than other scenes and may adjust the volume of the program during these portions to be closer to the volume levels of other scenes. The user may specify whether adjustments occur on a scene by scene basis.

In step 655, the system may pause the programming content according to user preferences. For example, if a conversation is detected and the user preferences indicate that the program should be paused, then the system may pause the program until the system determines that the conversation has ended. Alternatively, the system may pause the program until it receives input from a user that the program should be unpaused. Additionally/alternatively the system may adjust the volume of the program down in step 655. When adjusting the volume of the program down, the system may adjust all or some sound generating devices down. For example, the system may adjust the volume of all of the speakers down.

In step 660, after determining that the user preferences do not indicate that the program should be paused, the system may begin a loop for each speaker in the viewing environment to adjust individual speaker volume levels based on the detected audio in the room. Alternatively/additionally, the volume of the speaker that is closest to the user with a hearing or attention impairment, such as a person with a hearing aid, may be adjusted. The user with an impairment may be identified and tracked by the system. The system may identify and track the user via a wearable device that the user voluntarily allows the system to identify and track. The system may take into account the user's location when adjusting volume. For example, the system may adjust the volume of a speaker that is near a hearing impaired user by adjusting the volume of the speaker up. A user may be able to identify his or herself as hearing impaired. For example, a user may use his mobile device or a wearable device such as a smart watch to notify the system that he is hearing impaired.

The system may also communicate with a hearing aid or other wearable device associated with the hearing impaired user. The system may send the program audio to the hearing aid so that the hearing aid may output the audio to a user. The system may communicate with the hearing aid via Bluetooth, Wi-Fi, or through other wireless methods. The hearing aid may act as a mixer and control the balance between the program audio that is output to the user and the audio that comes from the user's surroundings, to raise and/or lower the volume of the room audio and/or program audio as described above. Alternatively the set-top box or DVR may handle the audio mixing, and the hearing aid may output the program audio that is received from the set-top box or DVR.

In step 665, the system may determine whether a conversation is occurring near a speaker. If no conversation is occurring near a speaker then the system may jump to step 675. In step 670, if a conversation is occurring near the speaker then the system may determine whether user preferences indicate the volume should be reduced. Additionally, if multiple users are present there may be conflicting preferences. The system may assign a priority level to different users. If conflicting preferences exist, the system may follow the preferences of the user with the highest priority level.

In step 673, the system may adjust the volume down if there is a conversation near the speaker and the user preferences do not prevent the system from adjusting the volume down. The system may wait to adjust the volume down until it detects that the volume of the conversation begins to rise. This may suggest that the program volume is too high, and the users are trying to talk over the program audio.

For adjusting volume, the system may use pre-trained machine learning software to determine how far up or how far down to adjust the volume on each speaker. The system may also use machine learning to continue to learn user preferences for each individual that is using the system. For example, the system may observe a user adjust the volume to a certain level during a conversation. After observing the user's adjustment, the system may then update its volume adjustment parameters so that it will make a similar adjustment for that user in the future. Additionally, the system may learn when to pause a program for a user based on observing different circumstances in which the user paused the program.

If no user preference is set, the default operation for the system may be to adjust the volume down at a speaker when a conversation is detected nearby. If the user preferences indicate that volume should not be adjusted down, the system may jump to step 675.

The conversation may be between two users viewing the program or it may be between a user and another person that has just entered into a room where the program is being viewed. The conversation may be between two people who are not watching the program being displayed. The conversation may also be between the user and someone located remotely. For example, the system may turn down the volume after detecting that a user has received a phone call and has begun a conversation over the phone. The system may detect a sound that it classifies as a phone ring and may adjust the volume down in response. The system may turn down the volume on all of the speakers in the viewing environment. Alternatively, the system may turn down the volume on one or more speaker that is nearby the user who has begun a conversation over the phone. In addition, the system may be connected to the phone and may filter out program audio that is input to the phone so that the person the user is talking with is unable to hear the program audio. Audio signals detected by a phone's microphone may be transmitted to the system, which may then filter out audio that the system is causing to be output by the speakers.

The system may also direct an out of band message to a particular speaker that is closer to the viewer. The system may avoid interrupting program audio by delivering a message through a signal that is separate from the signal that corresponds to the program audio. For example, the response from an utterance or a notification could be directed only to the speaker that is closest to the user instead of coopting all of the speakers or only relying on the speaker from the listening device itself.

In step 675, the system may determine whether a conversation has been detected that is far from the speaker to determine whether a speaker's volume should be adjusted to account for a conversation that is occurring (e.g., a conversation between two people is occurring on an opposite side of the room from the user who is watching a program). Volume adjustment may enable a nearby user to better hear the program when a conversation is present in the viewing environment that is not near the speaker. If no conversation is detected far from the speaker then the system may jump to step 687. If there is a conversation that is far from the speaker and the system determines there is a person watching the program near the speaker in step 680, then the system may determine whether the user preferences indicate that the volume should be increased in step 683. If there is no person watching the program near the speaker or if user preferences indicate that the volume should not be adjusted up, then the system may jump to step 687.

In step 685, the system may adjust the volume up at one speaker.

In step 687, the system may determine whether there is a non-conversation sound (e.g., a sound that interferes with a viewer trying to listen to program audio) near the speaker to determine whether to adjust volume up. If there is a non-conversation sound near the speaker, the system may adjust the volume of the speaker up in step 690. In step 695, the system may determine whether the loop 660 is on the last speaker. If the loop is not on the last speaker, the system may proceed to step 699. At step 699, the system may continue to the next speaker with step 665. If the loop is on the last speaker, then the system may proceed to step 697. At step 697, the system may go back to step 620 and continue from there.

The system may also incorporate cameras and make adjustments to the program based on hand gestures or other body language. Using cameras, the system may determine when a user is not facing the display of the program. If text appears on the program display while the user is not facing the display, the system may play the words out loud over the speaker. Additionally, the system may determine via the environment audio or via cameras that a viewer has left the room. After determining that a viewer has left the viewing environment, the system may delay a notification that is to be displayed on a screen until the viewer has returned to the viewing environment.

Further, if a live sports game is on and a user receives a phone call, the system may turn down the volume of the speakers because the audio may not be deemed as essential for the viewing experience. The system may have received information regarding the type of program in step 620. Using the information regarding the type of program and the preferences set by a user, the system may perform actions based on an event such as a phone call occurring. When a phone rings, the system may identify the sound as a phone ringing based on signal input into microphones (e.g. microphone 320). The system may also determine that the user has set a preference, for example, that audio volume be turned down when a phone rings and a live sporting event is on display 360. In this example, the system may then turn down the volume until the phone call ends (e.g., the system detects that the conversation is no longer taking place). As an additional example, if the show is being recorded, then the system might not pause the program.

As an example, the system may know that a user is sitting on the couch watching television at a particular volume level because the user's voice was detected by the microphones on the right of the microphone array (e.g. step 625 through step 645). The system may have determined, based on input from every microphone in the microphone array, that the ambient sound level is low (e.g., step 625). A loud vehicle may then stop outside of the user's house. The system may detect that the ambient sound is coming from outside because the ambient sound is strongest on the left of the microphone array (e.g. step 687). Based on the volume of the speakers received by the system, and the system's approximation of where the user is, the system may determine whether the ambient noise outside is loud enough to impact the user's viewing experience. If the ambient sound is loud enough to impact the user's viewing experience, the system may signal the set top box (or mobile device, depending on the screen that is currently being used by the user to watch content) to adjust the volume up to a level that will compensate (e.g., cause the program to be loud enough to hear over the ambient noise) for the ambient noise (e.g., step 690). Alternatively, if the user is viewing the television and not using the set top box, the system may upsample the audio in the television stream the user is viewing to raise the audio level. When the ambient noise level (factoring out the audio from the television itself) returns to its previous level, the system may return the volume to its previous level.

In another example, a user may be watching content on a couch with a friend. The volume may be at a high level because the content is an action movie. Based on a previous voice utterance, the system may know the user's position relative to the microphone array (e.g., step 645). The system may also know the audio level at which that utterance was captured. The user may start to have a conversation with the user's friend. The system may detect voices coming from the user's location. The system may also detect that the sound of the voices are not coming from the location of the speakers, and it may thus determine that the voices are not from the action movie (e.g., step 625 through step 635). The user and friend may begin to speak at an audio level that is elevated compared to the level at which the user's last utterance was captured and this may be detected by the system. The system may lower the volume of the content, allowing the user and friend to have a more enjoyable conversation. The system may lower the volume of speakers by controlling the output device directly or the system may lower the volume by remixing the audio upstream (e.g., step 673). Alternatively, if the user and friend were located close to one or more speakers and far from other speakers during their conversation, the system could decide to only lower speakers that are close to the user and friend (e.g., step 680 through step 685). The system may lower the volume of speakers that are facing the same direction as the user and friend relative to the position of the microphone array.

The methods and features recited herein may be implemented through any number of computer readable media that are able to store computer readable instructions. Examples of computer readable media that may be used include RAM, ROM, Electrically Erasable Programmable Read-Only Memory (EEPROM), flash memory or other memory technology, CD-ROM, DVD, other optical disk storage, magnetic cassettes, magnetic tape, magnetic storage, and the like.

Additionally, or alternatively, in at least some embodiments, the methods and features recited herein may be implemented through one or more Integrated Circuits (ICs). An IC may be, for example, a microprocessor that accesses programming instructions or other data stored in a ROM. In some embodiments, a ROM may store program instructions that cause an IC to perform operations according to one or more of the methods described herein. In some embodiments, one or more of the methods described herein may be hardwired into an IC. For example, an IC may comprise an Application Specific Integrated Circuit (ASIC) having gates and/or other logic dedicated to the calculations and other operations described herein. In still other embodiments, an IC may perform some operations based on execution of programming instructions read from ROM or RAM, with other operations hardwired into gates or other logic. Further, an IC may be configured to output image data to a display buffer.

Although specific examples of carrying out the disclosure have been described, those skilled in the art will appreciate that there are numerous variations and permutations of the above-described apparatuses and methods that are contained within the spirit and scope of the disclosure as set forth in the appended claims. Additionally, numerous other embodiments, modifications, and variations within the scope and spirit of the appended claims may occur to persons of ordinary skill in the art from a review of this disclosure. Specifically, one or more of the features described herein may be combined with any or all of the other features described herein.

The various features described above are merely non-limiting examples and may be rearranged, combined, subdivided, omitted, and/or altered in any desired manner. For example, features of the servers may be subdivided among multiple processors and/or computing devices. The true scope of this patent should only be defined by the claims that follow.

Although examples are described above, features and/or steps of those examples may be combined, divided, omitted, rearranged, revised, and/or augmented in any desired manner. Various alterations, modifications, and improvements will readily occur to those skilled in the art. Such alterations, modifications, and improvements are intended to be part of this description, though not expressly stated herein, and are intended to be within the spirit and scope of the disclosure. Accordingly, the foregoing description is by way of example only, and is not limiting.

The invention claimed is:

1. A method comprising:
   receiving, by a computing device, a media audio signal corresponding to a media item being output in an environment;
   detecting environmental audio,
   wherein the media audio signal is received prior to the environmental audio being detected,
   determining remaining audio by combining the environmental audio with an inverse of the media audio signal; and
   adjusting, based on the remaining audio, output of the media item.

2. The method of claim 1, wherein adjusting the output of the media item comprises at least one of:
   pausing the media item, or
   adjusting closed-captioning corresponding to a portion of the media item.

3. The method of claim 1, wherein adjusting the output of the media item is further based on classifying one or more portions of the remaining audio into at least one sound type, and
   wherein the at least one sound type comprises one or more of: a conversation, a doorbell ringing, a telephone ringing, footsteps, an appliance operating, construction work, a siren, an alarm, a vehicle, a dog barking, a door opening or closing, or a mobile device alert.

4. The method of claim 1, further comprising:
   determining an identity of a user in the environment; and
   retrieving user settings, associated with the user, indicating audio adjustment preferences that are based on one or more of:
   a content type of the media item,
   a scene of the media item being output,
   a location of the user in the environment,
   identities of one or more other users in the environment,
   ages of one or more other users in the environment, or a distance between a source associated with the remaining audio and a location of the user in the environment,
wherein adjusting the output of the media item comprises adjusting the output of the media item in accordance with the user settings.

5. The method of claim 1, further comprising:
determining a location, within the environment, of a source associated with the remaining audio,
wherein adjusting the output of the media item is further based on the location of the source associated with the remaining audio.

6. The method of claim 1, further comprising:
receiving, via Bluetooth or Wi-Fi and prior to outputting the media item in the environment, the media audio signal and information indicating a corresponding type of scene of the media item to be output,
wherein adjusting the output of the media item is further based on the type of scene of the media item to be output.

7. The method of claim 1, wherein adjusting the output of the media item comprises adjusting a volume level of a hearing-aid device of a hearing-impaired user in the environment.

8. The method of claim 1, wherein adjusting the output of the media item comprises:
sending, to a hearing-aid device, the media audio signal and an environmental audio signal comprising the environmental audio; and
causing the hearing-aid device to control a balance between the media audio signal and the environmental audio signal.

9. The method of claim 1, wherein adjusting the output of the media item comprises adjusting, based on determining that a distance between a user within the environment and an audio output device satisfies a distance threshold, a volume level of the first audio output device.

10. A non-transitory, computer-readable medium storing instructions that, when executed by a computing device, cause:
receiving a media audio signal corresponding to a media item being output in an environment;
detecting environmental audio,
wherein the media audio signal is received prior to the environmental audio being detected,
determining remaining audio by combining the environmental audio with an inverse of the media audio signal; and
adjusting, based on the remaining audio, output of the media item.

11. The non-transitory, computer-readable medium of claim 10, wherein adjusting the output of the media item comprises at least one of:
pausing the media item, or
adjusting closed-captioning corresponding to a portion of the media item.

12. The non-transitory, computer-readable medium of claim 10, wherein adjusting the output of the media item is further based on classifying one or more portions of the remaining audio into at least one sound type, and
wherein the at least one sound type comprises one or more of: a conversation, a doorbell ringing, a telephone ringing, footsteps, an appliance operating, construction work, a siren, an alarm, a vehicle, a dog barking, a door opening or closing, or a mobile device alert.

13. The non-transitory, computer-readable medium of claim 10, wherein the instructions, when executed by the computing device, further cause:
determining an identity of a user in the environment; and
retrieving user settings, associated with the user, indicating audio adjustment preferences that are based on one or more of:
a content type of the media item,
a scene of the media item being output,
a location of the user in the environment,
identities of one or more other users in the environment,
ages of one or more other users in the environment, or
a distance between a source associated with the remaining audio and a location of the user in the environment,
wherein adjusting the output of the media item comprises adjusting the output of the media item in accordance with the user settings.

14. The non-transitory, computer-readable medium of claim 10, wherein the instructions, when executed by the computing device, further cause:
determining a location, within the environment, of a source associated with the remaining audio, wherein adjusting the output of the media item is further based on the location of the source associated with the remaining audio.

15. The non-transitory, computer-readable medium of claim 10, wherein the instructions, when executed by the computing device, further cause:
receiving, via Bluetooth or Wi-Fi and prior to outputting the media item in the environment, the media audio signal and information indicating a corresponding type of scene of the media item to be output,
wherein adjusting the output of the media item is further based on the type of scene of the media item to be output.

16. The non-transitory, computer-readable medium of claim 10, wherein adjusting the output of the media item comprises adjusting a volume level of a hearing-aid device of a hearing-impaired user in the environment.

17. The non-transitory, computer-readable medium of claim 10, wherein adjusting the output of the media item comprises:
sending, to a hearing-aid device, the media audio signal and an environmental audio signal comprising the environmental audio; and
causing the hearing-aid device to control a balance between the media audio signal and the environmental audio signal.

18. A system comprising:
a first computing device; and
a second computing device configured to send, to the first computing device, one or more media audio signals;
wherein the first computing device is configured to:
receive, from the second computing device, a media audio signal corresponding to a media item being output in an environment;
detect environmental audio,
wherein the media audio signal is received by the first computing device prior to the environmental audio being detected,
determine remaining audio by combining the environmental audio with an inverse of the media audio signal; and
adjust, based on the remaining audio, output of the media item.

19. The system of claim 18, further comprising:
a hearing-aid device configured to receive one or more audio signals,
wherein the first computing device is configured to adjust the output of the media item by:
- sending, to the hearing-aid device, the media audio signal and an environmental audio signal comprising the environmental audio; and
- causing the hearing-aid device to control a balance between the media audio signal and the environmental audio signal.

20. The system of claim 18, further comprising:
a plurality of audio output devices configured to output the media audio signal,
wherein the first computing device is configured to adjust the output of media item by adjusting, based on a determination that a distance between a user within the environment and an audio output device satisfies a distance threshold, a volume level of the audio output device.

21. The method of claim 1, wherein adjusting the output of the media item is further based on a type of scene of the media item to be output.

22. The method of claim 1, wherein an entirety of the media audio signal, which is used to provide the inverse of the media audio signal that is combined with the environmental audio to determine the remaining audio, is received prior to the environmental audio being detected.

23. The method of claim 1, wherein the media audio signal is received via program information that includes audio of the output of the media item.

24. The method of claim 1, wherein the media audio signal comprises audio of the media item over a future time period with respect to when the environmental audio is detected.

* * * * *